(12) United States Patent
Rawat et al.

(10) Patent No.: US 12,198,741 B2
(45) Date of Patent: Jan. 14, 2025

(54) APPARATUS AND METHOD FOR FORMING AN OVERCOAT

(71) Applicant: Nanyang Technological University, Singapore (SG)

(72) Inventors: Rajdeep Singh Rawat, Singapore (SG); Choon Keat Paul Lee, Singapore (SG); Joseph Vimal Vas, Singapore (SG); Mayank Mishra, Singapore (SG); S. N. Piramanayagam, Singapore (SG)

(73) Assignee: Nanyang Technological University, Singapore (SG)

( * ) Notice: Subject to any disclaimer, the term of this patent is extended or adjusted under 35 U.S.C. 154(b) by 2 days.

(21) Appl. No.: 18/036,336

(22) PCT Filed: Nov. 16, 2021

(86) PCT No.: PCT/SG2021/050705
§ 371 (c)(1),
(2) Date: May 10, 2023

(87) PCT Pub. No.: WO2022/108526
PCT Pub. Date: May 27, 2022

(65) Prior Publication Data
US 2023/0419994 A1    Dec. 28, 2023

(30) Foreign Application Priority Data
Nov. 17, 2020  (SG) ............................. 10202011409R
Nov. 17, 2020  (SG) ............................. 10202011410Q

(51) Int. Cl.
*G11B 5/72* (2006.01)
*C23C 14/06* (2006.01)
(Continued)

(52) U.S. Cl.
CPC .......... *G11B 5/727* (2020.08); *C23C 14/0605* (2013.01); *C23C 14/34* (2013.01);
(Continued)

(58) Field of Classification Search
CPC . G11B 5/727; G11B 5/851; G11B 2005/0021; C23C 14/0605; C23C 14/34;
(Continued)

(56) References Cited

U.S. PATENT DOCUMENTS 9,940,963 B1 *  4/2018  Tang ...................... G11B 5/712
2010/0190036 A1 *  7/2010  Komvopoulos ...... C23C 14/325
                                                            118/723 R
(Continued)

FOREIGN PATENT DOCUMENTS

CN    101319324 A    12/2008
JP    2008-138289 A   6/2008

OTHER PUBLICATIONS

Bhatti et al., "High Energy Plasma Based Carbon Overcoat Deposition on Heat-Assisted Magnetic Recording Media," pp. 1-2.
(Continued)

*Primary Examiner* — Andrew Sasinowski
(74) *Attorney, Agent, or Firm* — Cesari and McKenna, LLP; Steven M. Mills

(57) ABSTRACT

Disclosed is an apparatus and method for forming a magnetic recording medium having a recording layer with a plurality of perpendicular magnetic domains configured to store data; and a carbon overcoat formed on the recording layer. The carbon overcoat is characterized by a sp3 carbon content greater than 70%, and a thickness of less than 1.2 nm.

20 Claims, 17 Drawing Sheets

(51) Int. Cl.
- C23C 14/34 (2006.01)
- G11B 5/851 (2006.01)
- H01J 37/32 (2006.01)
- G11B 5/00 (2006.01)

(52) U.S. Cl.
CPC ........ G11B 5/851 (2013.01); H01J 37/32568 (2013.01); *G11B 2005/0021* (2013.01); *H01J 2237/332* (2013.01)

(58) Field of Classification Search
CPC .. C23C 16/513; C23C 16/26; H01J 37/32568; H01J 2237/332; H01J 37/32055; H01J 37/32532
See application file for complete search history.

(56) References Cited

U.S. PATENT DOCUMENTS

| | | | |
|---|---|---|---|
| 2013/0202809 A1* | 8/2013 | Pitcher | C23C 14/48 427/523 |
| 2013/0244059 A1* | 9/2013 | Jones | G11B 5/8408 427/577 |
| 2019/0080713 A1* | 3/2019 | Ozyilmaz | G11B 5/7366 |

OTHER PUBLICATIONS

Ferrari, "Diamond-like carbon for magnetic storage disks," Surface & Coatings Technology, vol. 180-181, 2004, pp. 190-206.

Goohpattader, et al., "Probing the role of C+ ion energy, thickness and graded structure on the functional and microstructural characteristics of ultrathin carbon films (<2 nm)," Tribology International, vol. 81, 2015, pp. 73-88.

Marchon et al., "The Head-Disk Interface Roadmap to an Areal Density of 4 Tbit/in2," Advances in Tribology, vol. 2013, 2013, pp. 1-9.

Matlak et al., "Ultrathin amorphous carbon films synthesized by filtered cathodic vacuum arc used as protective overcoats of heat-assisted magnetic recording heads," Scientific Reports, vol. 8, No. 9647, 2018, pp. 1-11.

Saw et al., "A 160 kJ dual plasma focus (DuPF) for fusion-relevant materials testing and nano-materials fabrication," International Journal of Modern Physics: Conference Series, vol. 32, 2014, pp. 1460322-1 -1460322-10.

Saw et al., "Comparative numerical study of the dynamics, ion beam and flow energetics of fast and slow focus modes in a 2kJ plasma focus operated in various gases," Vacuum, vol. 165, 2019, pp. 337-342.

Soh et al., "Shadowgraphic Studies of DLC Film Deposition Process in Dense Plasma Focus Device," IEEE Transactions on Plasma Science, vol. 32, No. 2, 2004, pp. 448-455.

Yamamoto et al., "Development of a Coaxial Type Vacuum Arc Evaporation Source," International Conference on Ion Implantation Technology Proceedings, vol. 2, 2000, pp. 1148-1150.

Zin et al., "Preliminary results of Malaysian nuclear agency plasma focus (MNA-PF) as a slow focus mode device for argon and deuterium filling gas in correlation with Lee model code," AIP Conference Proceedings, vol. 1824, 2007, pp. 1-6.

International Search Report and Written Opinion of International Application No. PCT/SG2021/050705 mailed on Feb. 24, 2022.

* cited by examiner ns in a range from 0.8 nm to 1.1 nm. The magnetic recording medium according to any described above, wherein the carbon overcoat is characterized by a maximum roughness of 450 μm. The magnetic recording medium according to any described above, wherein the carbon overcoat is characterized by a maximum roughness of 435 pm.

APPARATUS AND METHOD FOR FORMING AN OVERCOAT

CROSS-REFERENCE TO RELATED APPLICATIONS

The present application is a National Stage Application, filed under 35 U.S.C. § 371, of International Application No. PCT/SG2021/050705, filed Nov. 16, 2021, which claims the benefit of priority to the Singapore patents application Ser. Nos. 10/202,011409R, filed Nov. 17, 2020, and 10202011410Q, filed Nov. 17, 2020, the entire contents of which are incorporated herein by reference.

The present application claims priority to the Singapore patent applications no. 10202011409R and 10202011410Q, the entire disclosures of which are incorporated herein by reference.

TECHNICAL FIELD

The present disclosure relates to the field of manufacturing of recording media, and more particularly to an apparatus and method for forming carbon overcoats for recording media.

BACKGROUND

Magnetron sputtering is one method of forming carbon overcoats for disk drive recording media. Magnetron sputtering uses a low energy argon plasma for sputtering a target. The resulting carbon overcoats are, as expected, characterized by a relatively low $sp^3$ content of around 30% or lower.

Another technical challenge is the tendency for pinholes to be formed in the carbon overcoats. Pinholes can lead to the exposure of the magnetic recording layer to the surrounding atmosphere, which in turn can lead to a higher corrosion level in the disk.

The filtered cathodic vacuum arc (FCVA) technique is another method of producing thin carbon films. Although the FCVA process seems to offer improvements over magnetron sputtering in terms of the $sp^3$ content obtainable, it involves cathodic ablation which leaves behind macroparticles. The presence of a tiny amount of macroparticles is unacceptable as it can lead to catastrophic damage to the disk drive.

SUMMARY

In one aspect, the present disclosure provides a magnetic recording medium, comprising: a recording layer having a plurality of perpendicular magnetic domains configured to store data; and a carbon overcoat formed on the recording layer, wherein the carbon overcoat is characterized by a $sp^3$ carbon content greater than 70%, and wherein the carbon overcoat is less than 1.2 nm in thickness.

The magnetic recording medium according to the above, comprising no more than one layer of the carbon overcoat.

The magnetic recording medium according to any described above, wherein the carbon overcoat is formed by a dense plasma focus (DPF) process using a gaseous carbon source at a pressure equal or less than 4 mbar.

The magnetic recording medium according to any described above, wherein the $sp^3$ carbon content of the carbon overcoat is greater than 78%. The magnetic recording medium according to any described above, wherein the $sp^3$ carbon content of the carbon overcoat is between 78% and 80%. The magnetic recording medium according to any described above, wherein the carbon overcoat has a thickness in a range from 0.8 nm to 1.1 nm. The magnetic recording medium according to any described above, wherein the carbon overcoat is characterized by a maximum roughness of 450 μm. The magnetic recording medium according to any described above, wherein the carbon overcoat is characterized by a maximum roughness of 435 pm.

The magnetic recording medium according to any described above, wherein the magnetic recording medium is characterized by a diameter of 65 mm.

A data storage device, comprising: the magnetic recording medium according to any one of the preceding claims; and a read/write device configured to read/write data from/to the recording layer through the carbon overcoat, the read/write device including a heat source configured to direct radiation toward the plurality of perpendicular magnetic domains in a heat assisted magnetic recording (HAMR) process, wherein the carbon overcoat decreases a coercivity of the magnetic recording medium by less than 3%.

A method comprising: forming a carbon overcoat on a deposition surface by a dense plasma focus process configured to deliver one or more shots of plasma from a gaseous source of carbon, the carbon overcoat being characterized by a $sp^3$ content greater than 70%, wherein each of the one or more shots of plasma forms a thickness of less than 1.2 nm per shot of the carbon overcoat.

The method according to any described above, further comprising providing the gaseous source of carbon at a pressure equal or less than 4 mbar.

The method according to any described above, further comprising providing the gaseous source of carbon at a pressure in a range from 1 mbar to 4 mbar. The method according to any described above, wherein the gaseous source of carbon is a mixture of methane in an inert gas. The method according to any described above, wherein the mixture comprises 1% to 10% of methane in neon.

The method according to any described above, wherein the deposition surface is spaced apart from a formation of the one or more shots of plasma by a deposition distance of 500 mm.

The method according to any described above, further comprising delivering the one or more shots of plasma using a dense plasma focus (DPF) device.

The method according to any described above, wherein the DPF device is configured to operate with an inductance of at least 300 nH to deliver the one or more shots of plasma. The method according to any described above, wherein the DPF device is configured with an inductance of 500 nH to deliver the one or more shots of plasma. The method according to any described above, wherein the DPF device is configured such that each of the one or more shots of plasma is characterized by an axial speed of less than 1 cm/μs.

The method according to any described above, wherein the DPF device is characterized by a drive parameter selected from a range from $0.5 \times 10^8$ A/m/$[kg/m^3]^{0.5}$ to $3 \times 10^8$ A/m/$[kg/m^3]^{0.5}$.

An apparatus comprising: a chamber configured to receive a gaseous precursor in an inert gas; a cathode; a coaxial anode having an end; a charging/discharging circuit configured to provide pulse high voltage across the anode and the cathode to form plasma discharge (plasma shot); and a support configured to support a deposition surface in the chamber such that the deposition surface is spaced apart from the end of the coaxial anode by a deposition distance, wherein the apparatus in operation is configured to provide the shot of plasma to form an overcoat on the deposition surface, and wherein the overcoat is less than 1.2 nm in thickness.

The apparatus according to any described above, wherein the gaseous precursor in the inert gas comprises a gaseous source of carbon in the inert gas at a pressure in a range from 1 mbar to 4 mbar, and wherein the overcoat is predominantly carbon and characterized by a $sp^3$ carbon content greater than 70%.

The apparatus according to any described above, wherein the shot of plasma has a plasma temperature of at least 200 eV in the pinched plasma column above anode top.

The apparatus according to any described above, wherein the charging/discharging circuit is characterized by a capacitance of 176 µF.

The apparatus according to any described above, wherein the charging/discharging circuit comprises a discharging circuit, the discharging circuit being characterized by an inductance of at least 300 nH. The apparatus according to any described above, wherein the inductance characterizing the discharging circuit is 500 nH.

The apparatus according to any described above, wherein the deposition distance is one between 100 mm to 500 mm.

The apparatus according to any described above, further comprising a glass sleeve disposed between the coaxial anode and the cathode, wherein the glass sleeve extends towards the end of the coaxial anode to cover at least a portion of the coaxial anode.

The apparatus according to any described above, wherein the coaxial anode is characterized by an anode radius of at least 40 mm. The apparatus according to any described above, wherein the coaxial anode is characterized by an anode length of at least 470 mm.

The apparatus according to any described above, wherein the cathode is characterized by a cathode radius that is twice the anode radius.

The apparatus according to any described above, wherein the apparatus is configured such that the shot of plasma is characterized by an axial speed of less than 1 cm/µs.

The apparatus according to any described above, wherein the apparatus is characterized by a drive parameter selected from a range from $0.5 \times 10^8$ A/m/[kg/m$^3$]$^{0.5}$ to $3 \times 10^8$ A/m/[kg/m$^3$]$^{0.5}$.

DETAILED DESCRIPTION

Figure 1:
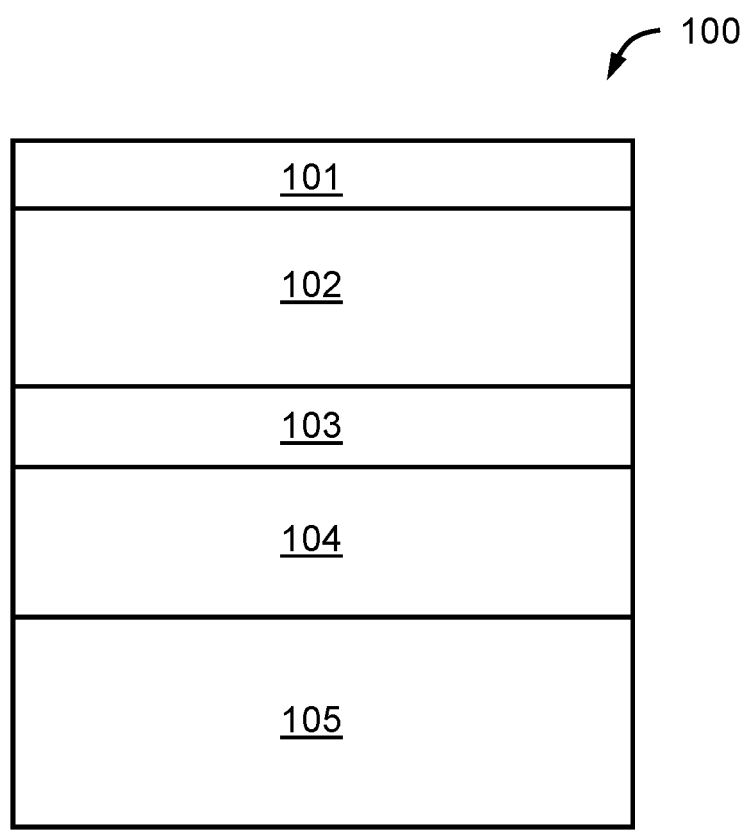
FIG. 1 is a schematic cross-section of a recording medium.

Reference throughout this specification to "one embodiment", "another embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment. Furthermore, the described features, structures, or characteristics may be combined in any suitable manner in one or more embodiments. In the following description, numerous specific details are provided to give a thorough understanding of embodiments. One skilled in the relevant art will recognize, that the various embodiments be practiced without one or more of the specific details, or with other methods, components, materials, etc. In other instances, some or all known structures, materials, or operations may not be shown or described in detail to avoid obfuscation.

The word "exemplary" is used herein to mean "serving as an example, instance, or illustration." Any embodiment described herein as "exemplary" is not necessarily to be construed as preferred or advantageous over other embodiments. As used herein, the singular 'a' and 'an' may be construed as including the plural "one or more" unless apparent from the context to be otherwise.

Terms such as "first" and "second" are used in the description and claims only for the sake of brevity and clarity, and do not necessarily imply a priority or order, unless required by the context. The terms "about" and "approximately" as applied to a stated numeric value encompasses the exact value and a reasonable variance as will be understood by one of ordinary skill in the art, and the terms "generally" and "substantially" are to be understood in a similar manner, unless otherwise specified.

Reference herein to an apparatus 200 or a dense plasma focus (DPF) device refers to a device that involves the formation and/or use of plasma (energized charged particles). The apparatus 200 of the present disclosure is also referred to as a slow focus mode dense plasma focus (SFM DPF) device, a large volume slow focus mode dense plasma (LVSFM DPF) device, or a DPF device of the present disclosure.

As is evident from the examples given below, the DPF device or apparatus 200 is configured to operate on a working principle distinctively different from that of a conventional fast focus mode dense plasma focus (FFM DPF) device. Prior to the present work, a large number of experimental iterations were conducted using a conventional DPF device, generally referred to herein as a FFM DPF device. It was found that merely adjusting the operating parameters of the conventional FFM DPF device could not yield the type of carbon thin film suitable for HAMR recording media. Essentially, the conventional FFM DPF device was designed to create conditions conducive for the study of nuclear fusion (typically referred to as a "fast focus mode"). This is achieved by optimal or efficient pinching of the plasma (efficient tight z-pinch) so that plasma instabilities produce a high-energy high-flux ions in the region of mega electron-volts. The operating principle of the convention FFM DPF device is such that the resulting plasma is a small volume characterized by high temperatures (— 1-2 keV) and high plasma density ($\sim 10^{24-26}$ m$^{-3}$). Therefore, if a magnetic media disk is put in a conventional FFM DPF device, instead of forming a protective carbon overcoat thereon, the magnetic media on disk will be damaged by the plasma stream and ion beams, rendering the disk useless for the purpose of data storage.

To aid understanding, the present disclosure will be made with reference to an improved method of making a carbon overcoat for a recording medium suitable for heat-assisted magnetic recording (HAMR) in data storage devices, the method also being one suitable for large-scale high-speed manufacturing so that it can be useful for practical industrial application. Nevertheless, it will be evident from the various non-limiting examples described below that the apparatus and method of the present disclosure are useful in a wide variety of applications, including but not limited to efficient production of recording media suitable for high-density perpendicular HAMR. For the purpose of illustration, the examples refer to the formation of one layer of carbon overcoat, but it will be understood that one or more layers of thin carbon films may be formed on a single disk, using the apparatus and method of the present disclosure.

A recording medium or a disk may be configured with various combinations of layers of different materials. FIG. 1 is a simplified schematic cross-section of a recording medium 100, not drawn to scale, provided to aid understanding and not to be limiting. Different examples of the recording medium may be formed by layers of different materials in various combinations and/or sequence. For example, the recording medium may include one or more interlayers 103 on a magnetic soft underlayer 104, and a base 105 (also referred to as a substrate) under the soft underlayer to provide structural support. The recording medium may include one or more recording layers. A recording medium 100 according to the present disclosure includes at least a carbon overcoat 101 disposed on a recording layer 102, generally the top-most recording layer. The recording layer 102 is configured with magnetic domains for storing data. In perpendicular recording, the recording layer 102 is configured with a plurality of perpendicular magnetic domains.

Figure 2:
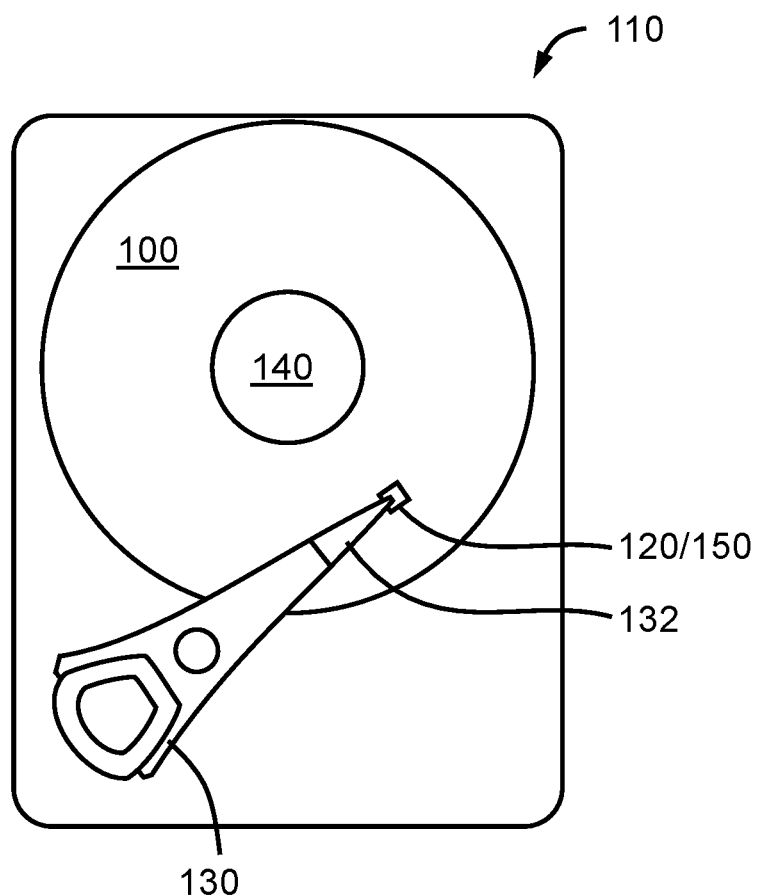
FIG. 2 is a schematic illustration of a disk drive.
Figure 3:
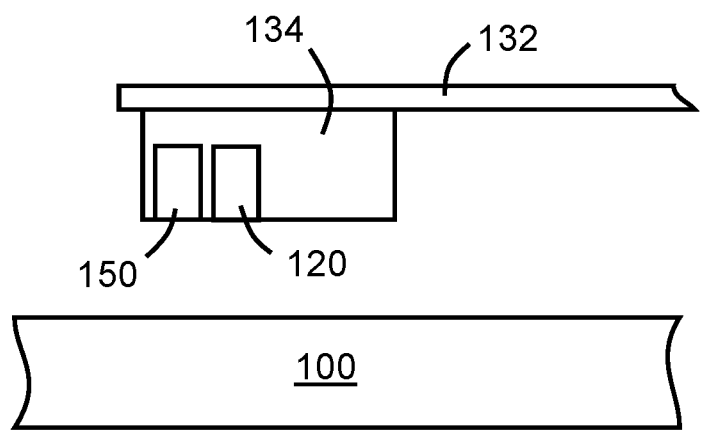
FIG. 3 is a schematic illustration of a read/write head of FIG. 2.

As schematically illustrated in FIGS. 2 and 3, in a data storage device or disk drive 110, a read/write head 120 on a slider 134 may be positioned by an actuator 130 at different radial locations relative to the recording medium 100, while the recording medium is concurrently rotated by a motor 140, so that data can be read from/written to different locations in the recording layer 102. The read/write head 120 is suspended from a suspension 132. The suspension 132 is cantilevered from the actuator 130 and biased toward the recording medium 100. In operation, the spinning of the recording medium 100 creates an air bearing (cushion of air between a surface of the recording medium and the read/write head) such that the read/write head 120 "flies" above the recording medium 100. The magnetic spacing between the read/write head and the recording medium is a balance between being small enough to facilitate high density recording and being large enough to avoid a collision of the read/write head 120 with the recording medium 100.

A HAMR device 150, such as a laser device, is disposed in/with the read/write head 120 to enable localized heating of the recording layer 102. The heating reduces the magnetic coercivity of the recording layer 102, which facilitates the writing of data to the recording layer 102 and enables data to be stored at a higher areal density. It can be appreciated that HAMR recording introduces additional requirements, e.g., the need for improved protection against corrosion in the recording layer 102 which will be subjected to cycles of intense localized heating and cooling in the course of HAMR.

Figure 4A:
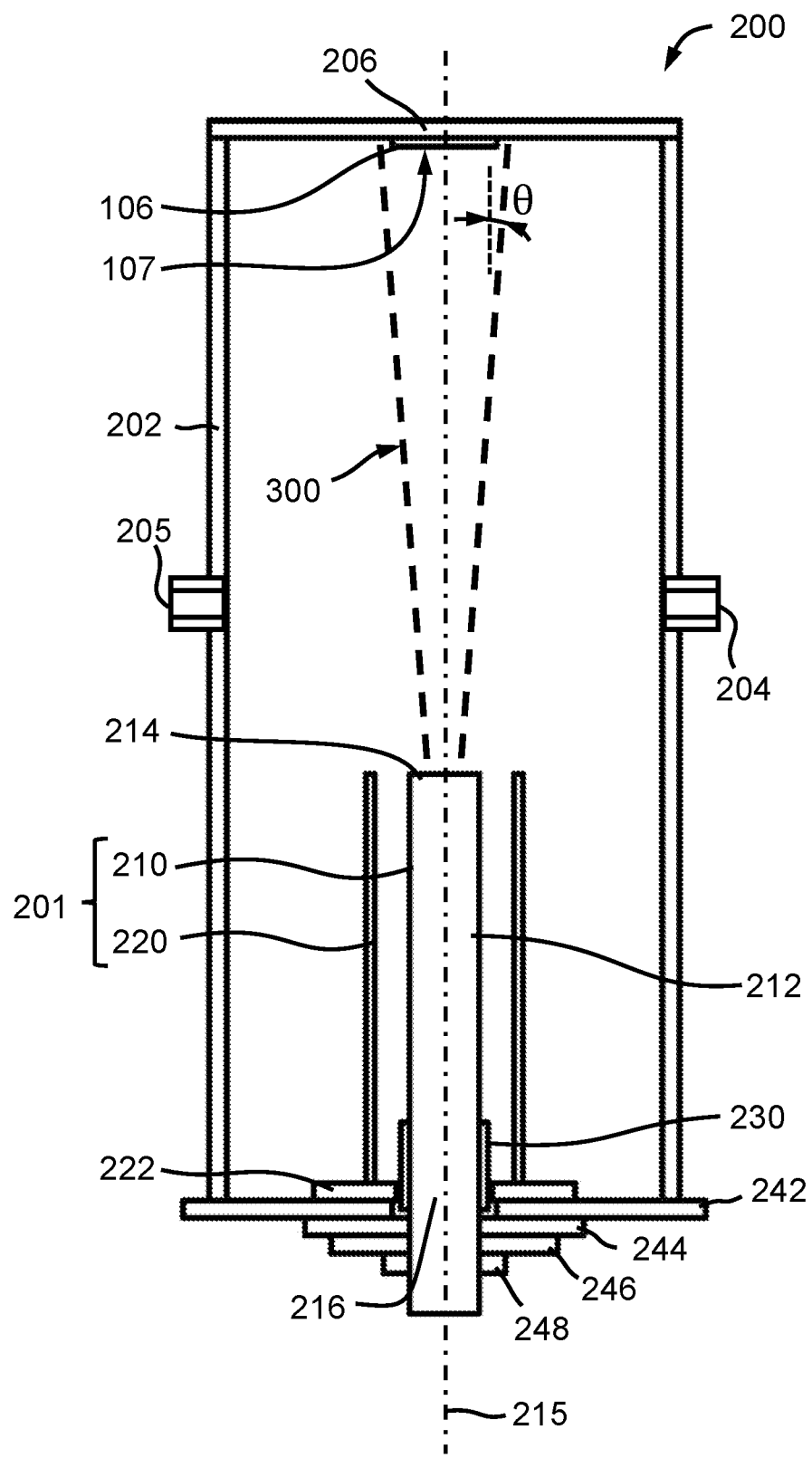
FIGS. 4A and 4B are schematic cross-sectional views of an apparatus according to an embodiment of the present disclosure.
Figure 4B:
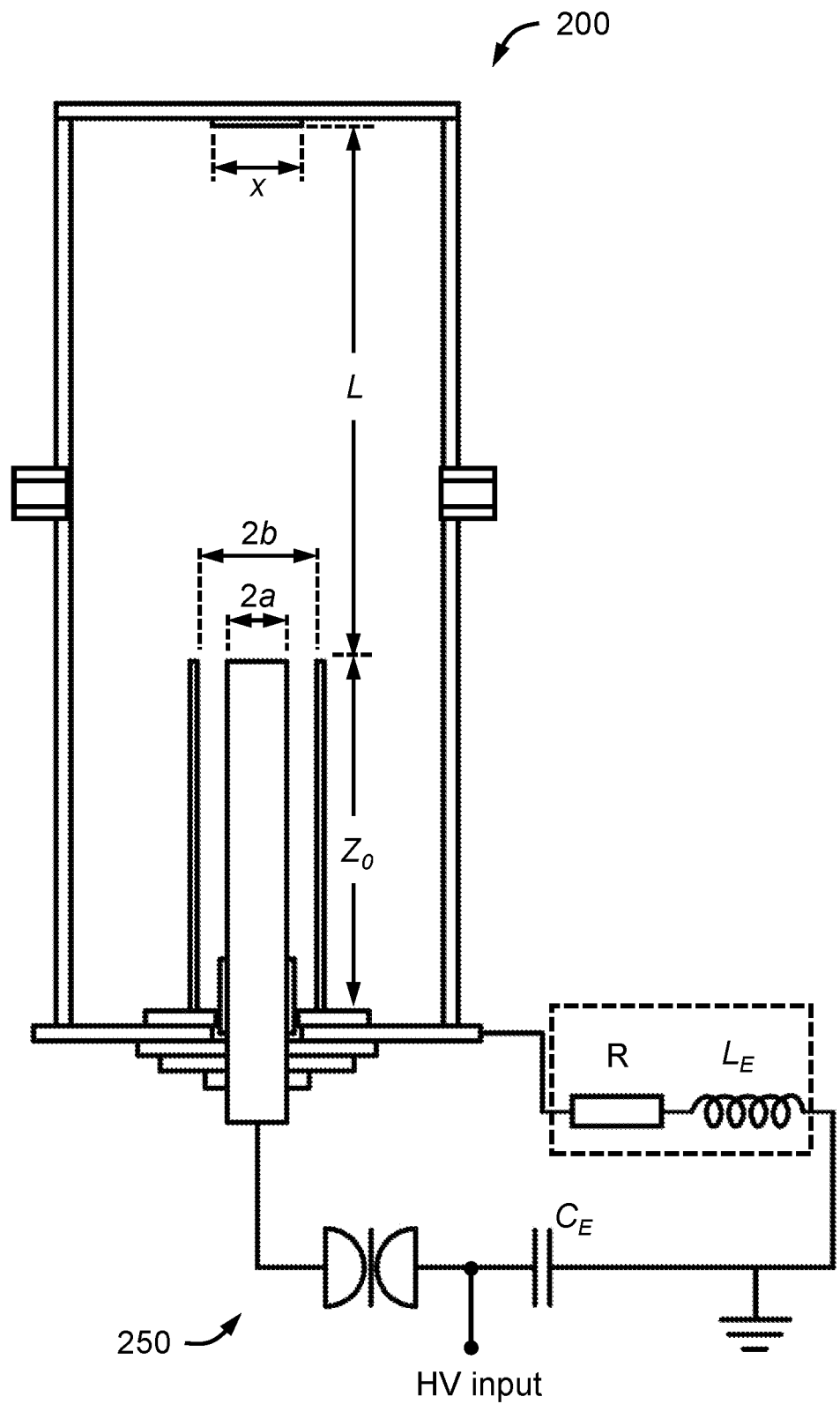

FIGS. 4A and 4B are schematic cross-sectional views of a DPF device or an apparatus 200 according to one embodiment of the present disclosure. The apparatus 200 of this embodiment may be interchangeably referred to as a dense plasma focus (DPF) device, a slow focus mode dense plasma focus device (SFM DPF device), or a large volume slow focus mode dense plasma focus device (LVSFM DPF device). The apparatus 200 includes a chamber 202 with electrodes 201 (an anode 210 and a cathode 220) disposed therein. The chamber 202 is configured to receive a gaseous precursor in an inert gas. The chamber may include an outlet 204 coupled to a vacuum unit suitably configured to evacuate the chamber 202. The chamber 202 may include an inlet 205 that can be selectively connected in fluid communication with one or more sources of gaseous precursors and/or inert gas. The chamber 202 is configured with a controllable operating pressure.

The anode 210 includes a longitudinal anode body 212 that defines an electrode axis 215 between one end 214 of the anode (the end of the anode is also referred to interchangeably as a "free end" or an "anode top") and a closed end 216. In one example, the anode body 212 is substantially cylindrical with a cross-sectional radius, i.e., an anode radius (a). The closed end 216 of the anode is coupled with or supported by the chamber 202. The electrodes 201 are characterized by rotational symmetry about the electrode axis 215. The anode 210 may be disposed substantially in the center of the chamber 202, with the cathode 220 diametrically disposed about the anode 210. The cathode 220 may take the form of elongate members distributed symmetrically about the anode 210. The cathode 220 is configured and disposed in the chamber 202 such that the cathode 220 as a whole is concentric and coaxial with the anode 210. The terms "anode" and "coaxial anode" are thus used interchangeably in the present disclosure. The cathode 220 may be spaced apart from the electrode axis 215 by a cathode radius (b). The cathode 220 may be coupled to the chamber 202 with the aid of a cathode base plate 222, such that the cathode 220 extends substantially parallel to the anode 210. A glass sleeve 230 is disposed between the closed end 216 of the anode and the cathode base plate 222 such that the anode 210 and the cathode 220 are electrically insulated from one another. An anode length (Z 0) is defined by a linear measurement from the cathode base plate 222 to the free end 214 of the anode, taken parallel to the electrode axis 215. The cathode base plate 222 is disposed on a ground plate 242. An insulating plate 244 ensures electrical insulation between the anode plate 246 and the ground plate 242. The anode 210 is secured to anode plate 246 by a suitable fastener 248 such as a nut.

The apparatus 200 includes a support 206 configured to receive and support a substrate 106 so that the substrate presents a deposition surface 107 facing the free end 214 of the anode. The deposition surface defines a processing area (x) over which it is intended to form a carbon overcoat. The support 206 is configured such that the deposition surface 107 is in substantial alignment with the anode 210 and substantially normal to the electrode axis 215. The support 206 is configured to support the deposition surface 107 in the chamber 202 such that the deposition surface 107 is spaced apart from the anode 210 by a deposition distance (L). The deposition distance (L) may be measured along the electrode axis 215 from the anode top 214 to the deposition surface 107.

FIG. 4B also shows a charging/discharging circuit 250 (also used interchangeably and/or collectively in referring herein to a "charging circuit" and/or a "discharging circuit") coupled across the anode 210 and the cathode 220. More specifically, the charging/discharging circuit 250 may be coupled to the closed end 216 of the anode and the cathode base plate 222 respectively. The charging/discharging circuit 250 is characterized by a capacitance (C E). In particular, the charging/discharging circuit 250 includes a discharging circuit, and the discharging circuit is characterized by an inductance (L E). The charging/discharging circuit 250 is operable to provide a charging voltage (V 0) across the electrodes 201. The capacitor/capacitor bank is charged by a high voltage power supply (HV input). The charging/discharging circuit 250 is configured to provide a charge between the anode 210 and the cathode 220 to form a shot of plasma 300. In other words, the charging/discharging circuit 250 is configured to provide a pulse of high voltage across the anode 210 and the cathode 220 to form a plasma discharge 300. The terms "plasma discharge", "plasma shot", "shot of plasma", and the like, are used herein interchangeably for the sake of brevity. The apparatus 200 is configured such that one shot of plasma 300 is sufficient to produce the desired carbon overcoat over the whole processing surface (in this example, a disk of 65 mm form factor). The entire carbon overcoat deposition process for one substrate 106 can be completed in sub-second time, such that actual implementing of the process in mass production is viable.

Figure 5:
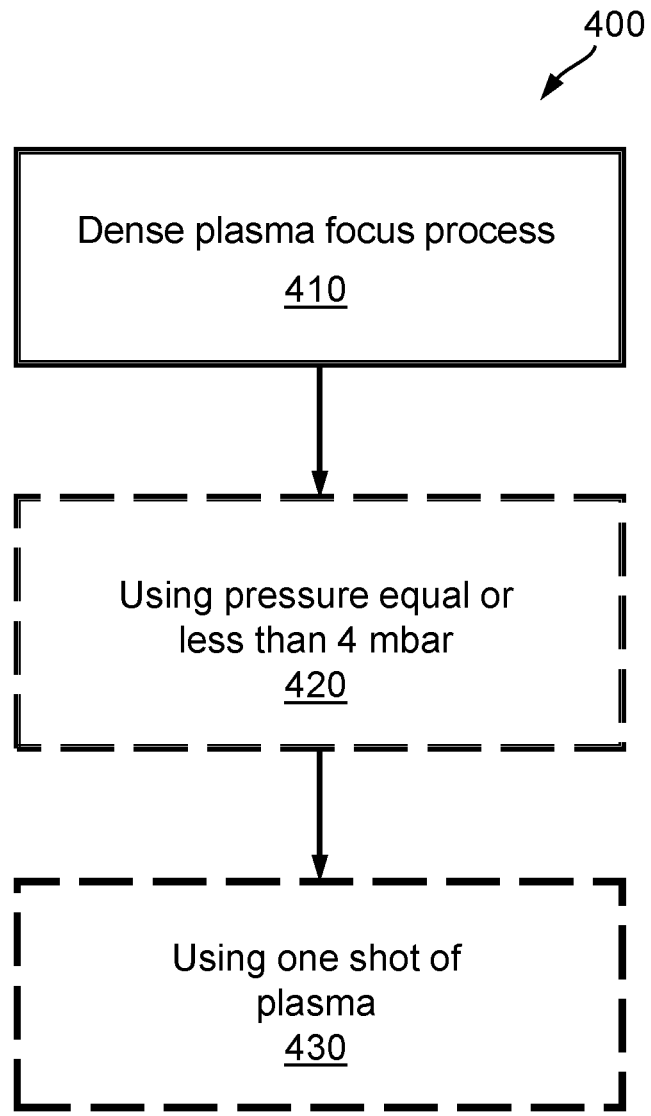
FIG. 5 is a schematic flow chart of a method according to embodiments of the present disclosure.

A method 400 of forming a carbon overcoat by a dense plasma focus process 410 (FIG. 5) will be described with reference to the apparatus 200 of FIGS. 4A and 4B. The method 400 includes chamber 202 is filled with a carbon precursor in an inert gas, for example, methane in neon (Ne:CH$_4$ in a ratio of 95:5), at an operating pressure equal or less than 4 mbar 420. In some examples, the method 400 includes using an operating pressure of about 1 to 4 mbar.

The capacitor is charged up so that when a discharge current is driven between the electrodes 201, the gas in the chamber 202 breaks down. The electrical discharge is initiated along the length of the electrodes (along the direction of the electrode axis 215 towards the anode top 214) because of the insulating glass sleeve 230. This produces an axially oriented Lorentz force that pushes a plasma sheath between the electrodes 201 towards the anode top 214.

The method 400 may include using one or more shots of plasma 430. Advantageously, a single shot of plasma formed by the method 400 can produce a carbon overcoat 101 of the desired quality, even over a relatively large deposition surface 107 such as the surface of a 65 mm form factor disk. The method 400 may be configured to provide a single shot of plasma with pinch plasma temperature in the range of hundreds to thousands of electron Volts, forming a carbon overcoat 101 in sub-second time, and yet produce a carbon overcoat 101 of uniform thickness and essentially defect-free for the purposes. For the sake of brevity, references herein to "pinch plasma temperature" or "plasma temperature" refer interchangeably to the temperature of the plasma in the pinched plasma column above the anode top. The single shot of plasma is also configured to form a carbon overcoat of 0.8 to 1.1 nm, in which the carbon overcoat is characterized by a sp$^3$ content of over 70%. This single-shot efficiency can mean a significant improvement in the overall efficiency in the context of high-volume manufacturing.

Figure 6A:
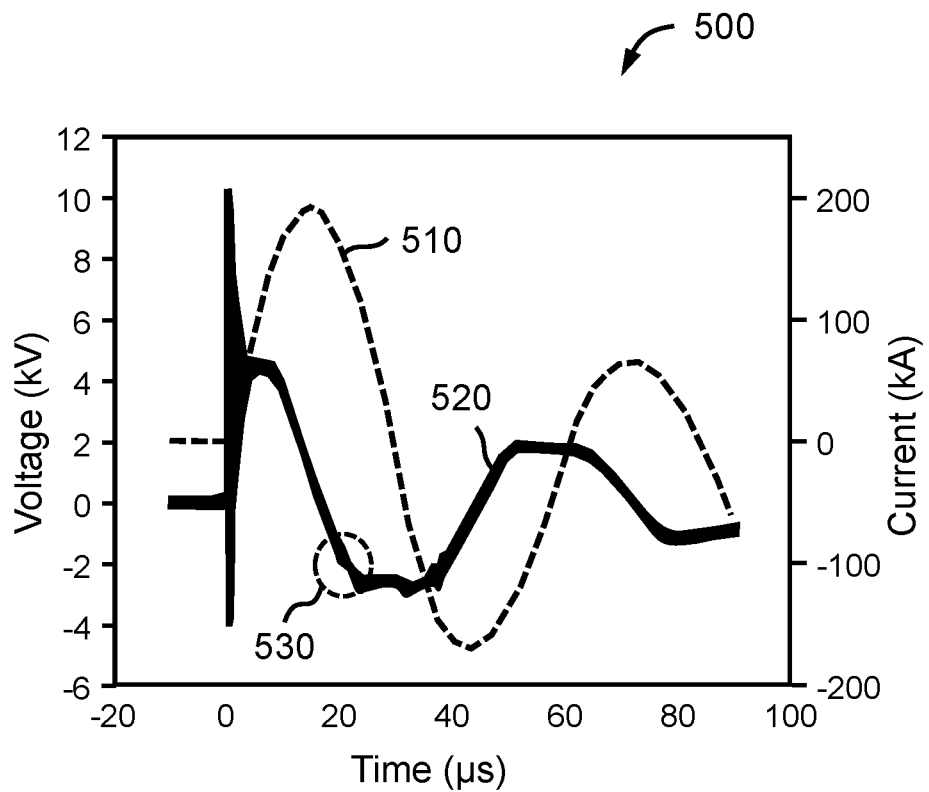
FIG. 6A shows plots of discharge voltage and current over time according to the method of FIG. 5.
Figure 7A:
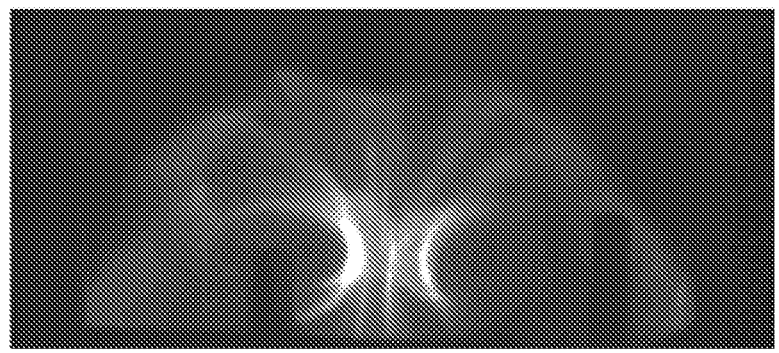
FIG. 7A is an image of the plasma without a tight pinch, corresponding to the method of FIG. 6A.

FIG. 6A shows plots 500 of discharge voltage 510 and current 520 over time in the DPF device or apparatus 200 of the present disclosure. FIG. 7A shows an image of the plasma distribution proximal the anode top 214 in the apparatus 200, corresponding to an instant 530 equivalent to a "slow pinch" or "delayed pinch". As shown, the apparatus 200 is configured such that there is no tight pinching of the plasma at the anode top 214. The apparatus 200 is configured to operate in a slow focus mode in which pinching 530 does not coincide with the peak (or maxima) of the current signal. The pinching is deliberately delayed to a time of low pinch current. The delay is enabled by the discharging circuit 250 of the apparatus 200 which has been configured with a relatively high inductance (L E). In some examples of the apparatus 200, the discharging circuit 250 is configured with a capacitance (C E) of about 176 g and an inductance (L E) of about 500 nH.

Figure 6B:
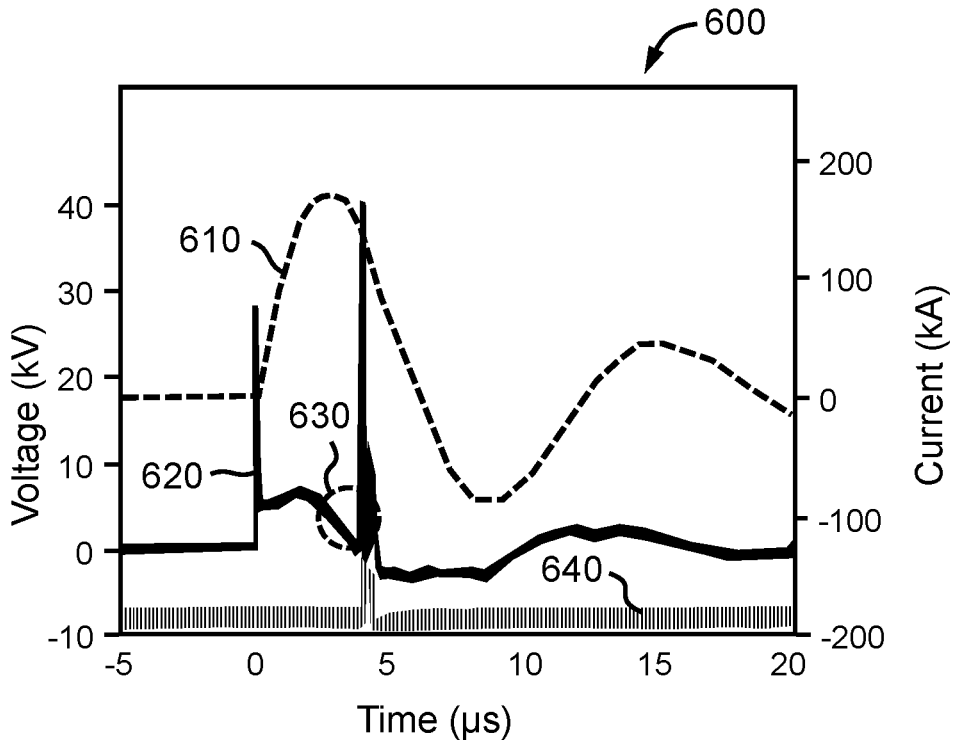
FIG. 6B shows plots of discharge voltage and current over time for a conventional device.
Figure 7B:
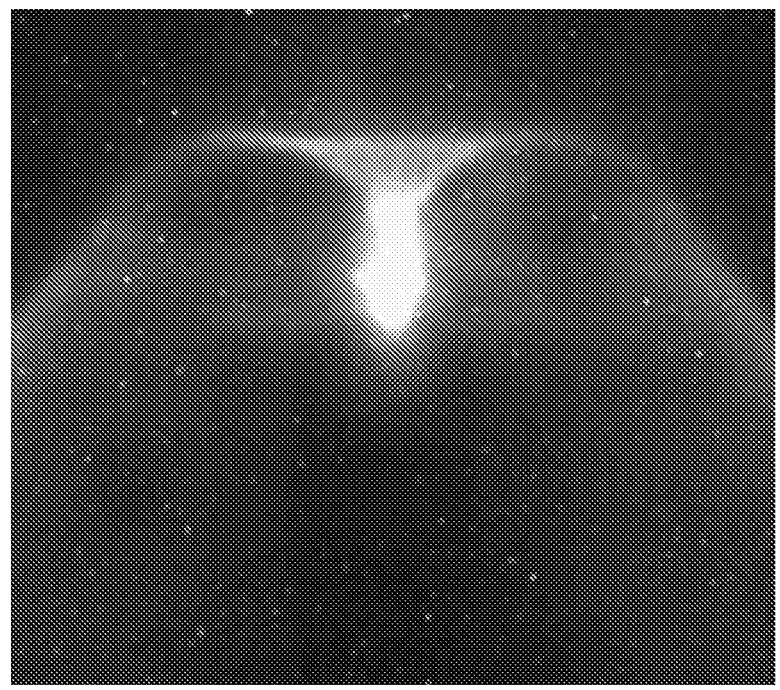
FIG. 7B is an image of a tight pinch, corresponding to the method of FIG. 6B.

FIG. 6B shows plots 600 of discharge voltage 610 and current 620 over time in a conventional dense plasma focus device, also referred to herein as a fast focus mode dense plasma focus (FFM DPF) device. It is evident from the voltage plots 510, and 610 that distinctly different processes occurred in the respective devices. The conventional FFM DPF process shows a compression or tight pinch 630 occurring around 5 µs, corresponding to the image shown in FIG. 7B. FIG. 7B is an image taken of a tight plasma pinch formed in a conventional FFM DPF device in response to a camera signal 640. This is consistent with the operating principle of the conventional FFM DPF device which requires an efficient compression or a tight pinch so that the plasma instabilities induced forms the desired shot of high energy and high temperature plasma, typically of a relatively small volume.

Because a tight plasma pinch is not formed in LVSFM DPF, plasma instabilities and intense plasma streams were not observed in the apparatus 200 or in the method 400 of the present disclosure. This means that the embodiments of the present disclosure advantageously do not produce damaging streams of plasma that cause a deterioration of the substrate. Further, the method 400 ensures that a large volume of plasma is available during at a plasma temperature high enough to provide the high energy highly ionized states of carbon ions needed for high sp$^3$ content in the deposited carbon layer, and yet without the risk of damaging the substrate 106. The plasma volume obtainable by the method 400 can be as much as approximately 400 times that of the conventional FFM DPF process.

A magnetic recording medium 100 formed by the method 400 can include: a recording layer 102 having a plurality of perpendicular magnetic domains configured to store data; and a carbon overcoat 101 formed on the recording layer 102. The carbon overcoat 101 formed according to embodiments of the present disclosure is characterized by a sp³ carbon content greater than 70%, and a thickness of less than 1.2 nm. In some examples, the sp³ carbon content of the carbon overcoat 101 is greater than 78%. In some examples, the sp³ carbon content of the carbon overcoat 101 is between 78% and 80%.

The magnetic recording medium 100 may be configured with no more than one layer of the carbon overcoat 101 by a dense plasma focus (DPF) process 400 using a gaseous carbon source at a pressure equal or less than 4 mbar. The carbon overcoat 101 formed may have a thickness in a range from 0.8 nm to 1.1 nm. In some examples, the carbon overcoat 101 is characterized by a maximum roughness of 450 µm. In some examples the carbon overcoat 101 is characterized by a maximum roughness of 435 pm. The magnetic recording medium 100 may be one characterized by a diameter of 65 mm.

The apparatus 200 and method 400 of the present disclosure will be described in terms of working principles and operating parameters to aid understanding. The apparatus 200 may be described in terms of the drive parameter P and the axial speed C a as shown below in Equations (1) and (2) respectively.

$$\text{Drive parameter, } P = \frac{I_p}{a\rho^{1/2}} \quad (1)$$

$$\text{Axial speed, } C_a = \frac{\mu \ln c}{4\pi^2 (c^2 - 1)} \quad (2)$$

where $I_p$ is the peak current, a is the anode radius, ρ is the gas density, µ is the permeability of free space, and c is the ratio of the cathode radius to the anode radius.

In the present example, these parameters are configured to be in a range of:

$$P \approx 0.5 - 3 \times 10^8 \text{ A/m/[kg/m}^3]^{0.5} \quad (3)$$

$$C_a \leq 1 \text{ cm/µs} \quad (4)$$

The apparatus 200 is configured with a vacuum system and electrode geometry that would ensure that the apparatus 200 operates in a slow focus mode of method 400 when under the selected operating pressure. The operating pressure $P_0$ may be defined as follows:

$$P_0 = \frac{760 I_d M}{n^2 m \rho_{1(STP)} A_v} \quad (5)$$

where $P_0$ is the operating pressure, $I_d$ is the required ion density per cubic meter, M is the molar mass of the operating gas, n is the compression efficiency, m is the number of atoms per molecules of gas; $P_{1(STP)}$ is the density of the operating gas at STP (standard temperature and pressure), and $A_v$ is the Avogadro number.

The anode 210 may be configured according to the target processing area (area of the deposition surface to be coated with a carbon overcoat) and a designed compression efficiency. The apparatus 200 of the present disclosure is configured to promote non-optimal compression of the pinch column. The pinch radius r p may be expressed in terms of the compression efficiency n as follows:

$$r_p \leq a/n \quad (6)$$

The anode radius α can be estimated as follows:

$$\alpha \geq n(x - 0.27L) \quad (7)$$

$$L(\text{cm}) \in (10, 50) \quad (8)$$

where x is the diameter of the processing area and L is the deposition distance (distance measured parallel to the electrode axis, from the free end of the anode to the processing area). The deposition distance is selected such that materials may be deposited on the deposition surface without damaging it. A relatively large anode radius may be preferred so that a correspondingly large pinch radius and pinch length can be obtained (as opposed to a tight pinch). For a selected anode radius, the peak current and the cathode diameter can be estimated based on equations (1) and (2). The charging voltage $V_0$ may be chosen so that the initial breakdown of the plasma will occur across the glass sleeve, based on the Paschen's curve of the operating gas.

The electrical parameters may be configured on the basis that the time when the pinch occurs is close to the first zero crossing of the voltage signal. This time is to be synchronized with a sum of the axial phase time (length of time spent in the axial phase) and the radial phase time (length of time spent in the radial phase), which are given as:

$$t_r = \frac{4\pi}{\mu^{1/2}(\gamma+1)} \frac{a^2 \rho^{1/2}}{I_0} \quad (9)$$

$$t_a = \frac{Z_0}{C_a} \quad (10)$$

where γ is the specific heat ratio of the plasma at the operating pressure. The axial phase time is configured to be 10 to 15 times of the radial phase time. The axial phase time can be estimated from the radial phase time. The anode length $Z_0$ can be estimated based on the axial phase time.

The total time period of the electrical network can be estimated as follows:

$$t = 2(t_r + t_a) \quad (11)$$

The inductance L E and the capacitance C E of the electrical circuit can be determined based on the following equations:

$$t = 2\pi \sqrt{L_E C_E} \quad (12)$$

$$V = I \sqrt{\frac{L_E}{C_E}} \quad (13)$$

In operation, some of the parameters may be changed. For example, the operating pressure may be varied to obtain different pinch sizes to suit different processing areas, etc.

It can be appreciated that the operating parameters characterizing embodiments of the present disclosure differ from those of a conventional FFM DPF device or process. For example, the drive parameter and the axial speed of a device corresponding to a conventional FFM DPF device in a deuterium operation configured for neutron yield are as follows:

$P \approx 96$ kA/cm/[torr $D_2$]$^{0.5}$ or $P \approx 8.8 \times 10^8$ A/m/[kg/m$^3$]$^{0.5}$ for any operating environment (14)

$C_a = 5.4$ cm/µs (15)

For optimal pinch conditions (as in the case of a conventional FFM DPF), the following relations apply:

$r_p \leq 0.1a$ (16)

$z_p \approx 0.8a$ (17)

$t_p(ns) \approx 2a(mm)$ (18)

where $r_p$ is the radius of the final pinch column at the end of the compression phase of a convention FFM DPF process, a is the anode radius, $z_p$ is the length of the pinch and $t_p$ is the pinch duration in nanoseconds.

It can be appreciated from the above that the conventional FFM DPF apparatus would be rendered inoperable if modified to form the thin films described in the present disclosure.

Table 1 below summarizes the operating parameters of the apparatus 200 and method 400, according to a non-limiting example of the present disclosure.

TABLE 1

| Operating Parameter | Example 1 |
| --- | --- |
| Anode radius, a | ~40 mm |
| Cathode radius, b | ~80 mm |
| Anode length, $Z_0$ | ~470 mm |
| Processing area, x | 65 mm |
| Capacitance, $C_E$ | ~176 µF |
| Inductance, $L_E$ | ~500 nH |
| Charging voltage, $V_0$ | ~12 kV |
| Operating pressure, $P_0$ | ~1 mbar Neon |
| Gas | Ne:CH$_4$ (95:5) |
| Quarter time period, t | ~13-14 µs |
| Peak current | ~200 kA |
| Current during pinch | ~150 kA |
| Drive parameter | $1.77 \times 10^8$ A/m/[kg/m$^3$]$^{0.5}$ |

Table 2 below lists the operating parameters of another non-limiting example of the apparatus 200 and method 400.

TABLE 2

| Operating Parameter | Example 2 |
| --- | --- |
| Anode radius, a | ~80 mm |
| Cathode radius, b | ~160 mm |
| Anode length, $Z_0$ | ~470 mm |
| Processing area, x | 65 mm |
| Capacitance, $C_E$ | ~176 µF |
| Inductance, $L_E$ | ~500 nH |
| Charging voltage, $V_0$ | ~12 kV |
| Operating pressure, $P_0$ | ~2 mbar |
| Gas | Ne:CH$_4$ (95:5) |
| Quarter time period, t | ~13-14 µs |
| Peak current | ~200 kA |
| Current during pinch | ~150 kA |
| Drive parameter | $6.27 \times 10^7$ A/m/[kg/m$^3$]$^{0.5}$ |

The operating parameters given above are to aid understanding and not to be limiting, and one skilled in the art would be able to make variations within the scope of the claims without inventive effort. For example, the method 400 may include providing the gaseous source of carbon at a pressure equal or less than 4 mbar. The DPF device or apparatus 200 may be configured such that the gaseous precursor in the inert gas includes a gaseous source of carbon in the inert gas provided at a pressure in a range from 1 mbar to 4 mbar. The gaseous source of carbon may be a mixture having 1% to 10% of methane in neon. The carbon overcoat 101 may be predominantly carbon and characterized by a sp3 carbon content greater than 70%. The shot of plasma may be provided at a plasma temperature of at least 200 eV. The apparatus 202 may be configured such that the deposition distance is one between 100 mm to 500 mm. The deposition surface 107 may be spaced apart from a formation of the one or more shots of plasma by a deposition distance of 500 mm.

The apparatus 200 may be configured such that the charging/discharging circuit 250 is characterized by a capacitance of 176 µF. In some cases, the discharging circuit 250 is characterized by an inductance of at least 300 nH. In some cases, the inductance characterizing the discharging circuit 250 is 500 nH.

The apparatus 200 may include a glass sleeve 230 disposed between the coaxial anode 210 and the cathode 220. The sleeve 230 may be selected from sleeves made of other electrically non-conductive materials capable of withstanding the conditions within the chamber 202. The glass sleeve 230 may be configured to extend towards the end 214 of the coaxial anode to cover at least a portion of the coaxial anode 210. The coaxial anode 210 may be characterized by an anode radius of at least 40 mm. The coaxial anode 210 may be characterized by an anode length of at least 470 mm. The apparatus 200 may be configured such that the cathode 220 is characterized by a cathode radius that is twice the anode radius.

The apparatus 200 may be configured such that the shot of plasma is characterized by an axial speed of less than 1 cm/µs. The apparatus 200 may be characterized by a drive parameter selected from a range from $0.5 \times 10^8$ to $3 \times 10^8$ A/m/[kg/m$^3$]$^{0.5}$.

Various embodiments of the DPF device or apparatus 200 are useful in a variety of practical applications. For example, the apparatus 200 can be used to carry out ultra-fast single-shot deposition of different materials in sub-second time. Applications include the formation of thin films from a source, in which the source is in a gaseous phase, a solid phase, or a mixture of gaseous and solid phases. The apparatus 200 and related method 400 are not limited to using a methane and neon gaseous mixture for a gaseous carbon-containing precursor-based synthesis. The apparatus 200 is also not limited to the production of carbon overcoats for recording media. The apparatus 200 and method 400 may be used in large area superhydophilic silicon dioxide coating for anti-fogging applications, e.g., by fitting a solid silicon piece to the anode, and using oxygen in place of neon. The apparatus 200 and method 400 may be used nitriding or carbiding of substrates to improve or confer surface properties. Other uses include the synthesis of custom alloys.

According to one embodiment of the present disclosure, for example, a high-speed coating process to provide an overcoat 101' (of a material including but not limited to one predominantly of carbon) may be implemented by an apparatus 200 configured with: a chamber 202 configured to receive a gaseous precursor in an inert gas; a cathode 220; a coaxial anode 210 having an end 214; a charging/discharging circuit 250 configured to provide a charge between the anode 210 and the cathode 220 to form a shot of plasma 300; and a support 206 configured to support a deposition surface 107 in the chamber 202 such that the deposition surface 107 is spaced apart from the end 214 of the coaxial anode by a deposition distance L. The apparatus 200 in operation is configured to provide the shot of plasma to form the overcoat 101' on the deposition surface 107. The overcoat 101' can be formed as a thin film of less than 1.2 nm in thickness. The method 400 is capable of forming the overcoat 101' on a deposition surface 107 by a dense plasma focus process 410 configured to deliver one or more shots of plasma from a gaseous source of the overcoat material. That is, the method 400 may be configured to deliver one or more shots of plasma using a dense plasma focus (DPF) device, although the efficiency may require no more than one shot of plasma to coat a processing area of up to 65 mm in diameter (or a diametrically measured dimension). The total thickness of the overcoat 101' in a finished product may be various thicknesses, e.g., by using multiple shots of plasma. A single shot of plasma is capable of forming a layer that is no more than 1.2 nm, i.e., the overcoat 101' may be formed at a rate of less than 1.2 nm per shot of plasma. The apparatus 200 and the method 400 are thus suitable for a wide range of thin film processes. The overcoat 101' may be characterized by a high percentage of a high energy atomic content, e.g., equal or greater than 70% sp3 carbon in the case of a carbon overcoat.

The viability and performance of the apparatus 200 and the method 400 for producing good quality overcoats was verified experimentally from various aspects and are described below.

Roughness Measurements

Figure 8:
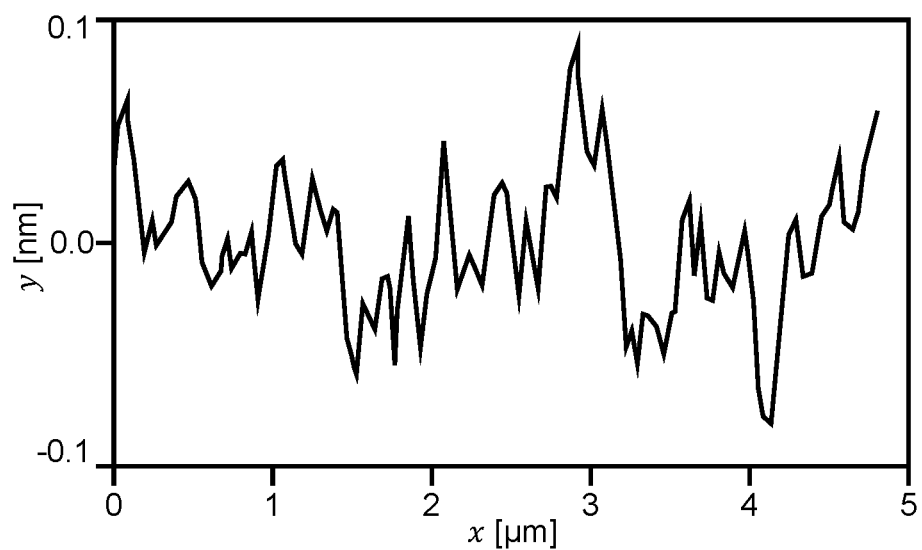
FIG. 8 is an atomic force microscope line scan for determining a roughness of a carbon overcoat formed using the apparatus and method of the present disclosure.

Samples of carbon overcoats were formed on 65 mm recording media using the apparatus 200 and method 400. The samples were studied using an atomic force microscope. Several sample areas of 10 μm×10 μm were selected from the carbon overcoats formed, and mapped in terms of three-dimensional roughness maps and corresponding line scans. FIG. 8 shows an example of one of the line scans obtained. The roughness of the samples was found to be approximately 250±185 picometer (pm), well within the requirements of carbon overcoat requirements for HAMR-related applications. Although data suggests some particle contamination, these were consistent with the expected range for experiments conducted outside a clean room environment and with possible contamination during sample transfer.

AFM-Based Thickness Measurements

One plasma shot is sufficient to form the desired carbon overcoat. However, the carbon overcoat obtainable using the SFM DPF device and method of the present disclosure formed is so thin that it is not visible under an optical microscope. For the purpose of determining the thickness of the carbon overcoat obtainable in one plasma shot, a multi-shot strategy was used. The deposition surface was subjected to multiple shots of plasma, the total thickness of the carbon overcoat was measured, and the thickness of the carbon overcoat obtainable in one shot of plasma was estimated.

Figure 9A:
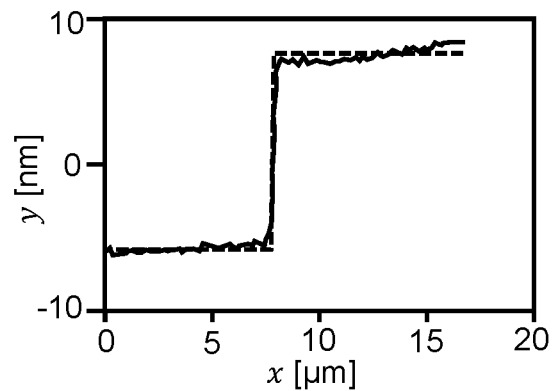
FIGS. 9A and 9B are thickness measurement data for multiple shots of plasma using a 90:10 Ne:CH$_4$ mixture.
Figure 9B:
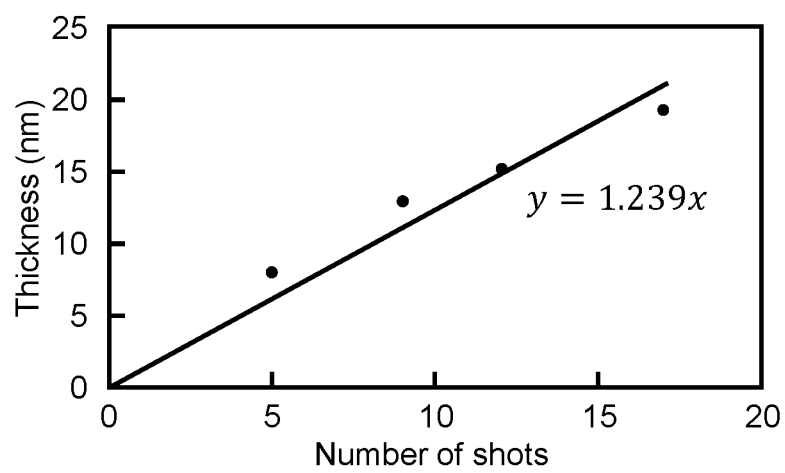

FIG. 9A shows a step representing the additional thickness obtained as a result of multiple shots of plasma, from a SFM DPF process using a Ne:CH$_4$ gaseous mixture in the ratio of 90:10. Since each shot of plasma (exposure shot) is expected to deposit approximately the same thickness of carbon, a linear fit was used to fit the plot of thickness (of carbon) against the number of plasma shots, as shown in FIG. 9B. The carbon overcoat deposited was about 1.2 nm thick per shot of plasma.

Figure 10A:
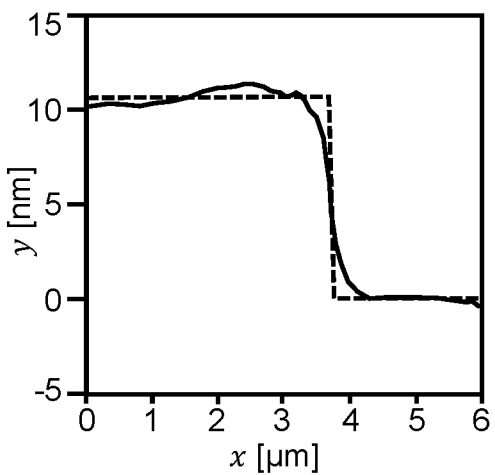
FIGS. 10A and 10B are thickness measurement data for multiple shots of plasma using a 95:5 Ne:CH$_4$ mixture.
Figure 10B:
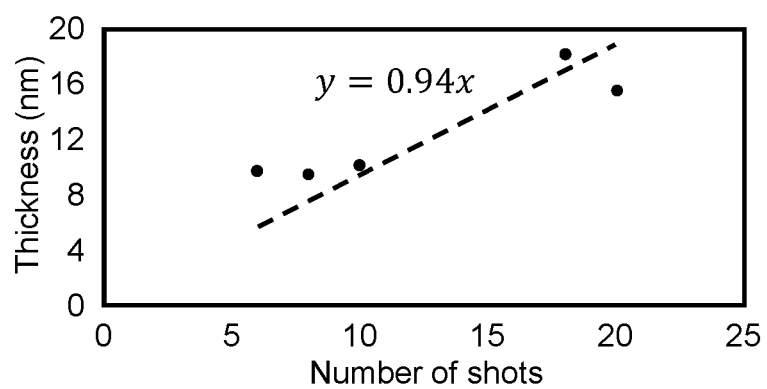
Figure 12A:
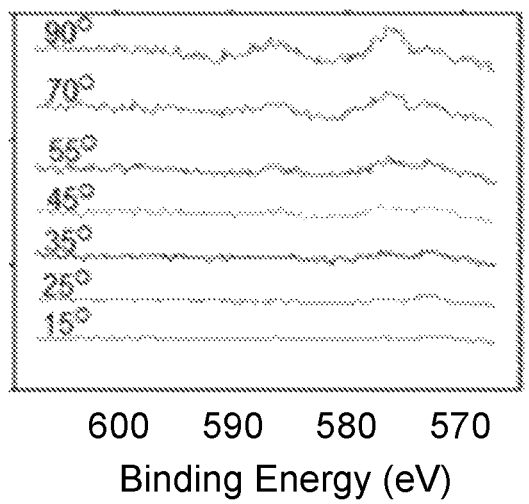
FIGS. 12A to 12G show angle resolved photoemission spectroscopy (ARPES) spectra obtained for the sample of FIG. 11.
Figure 12B:
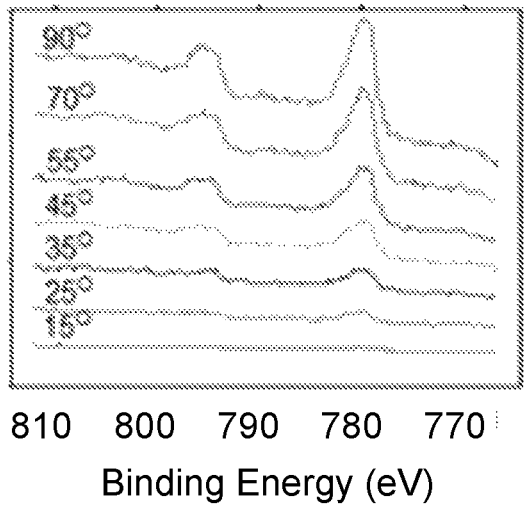
Figure 12C:
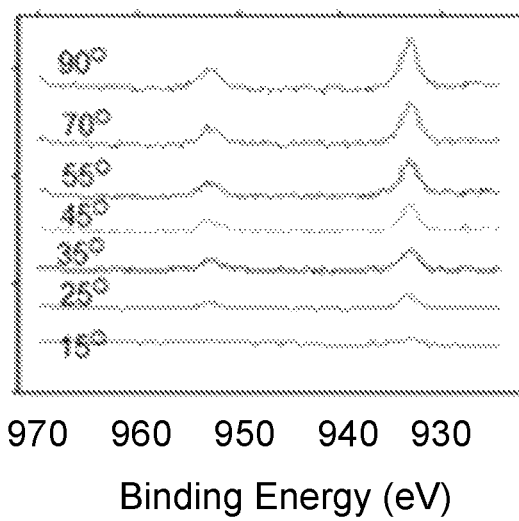
Figure 12D:
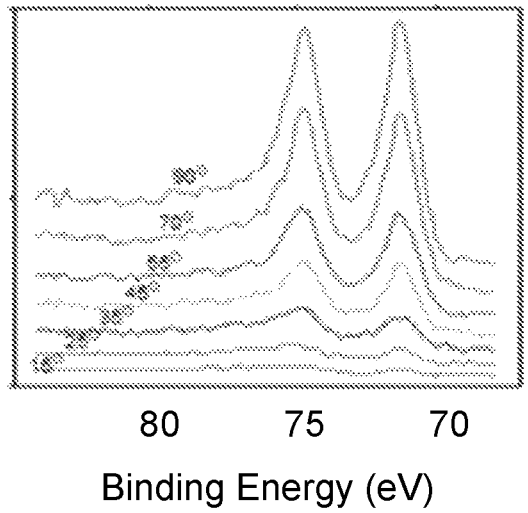
Figure 12E:
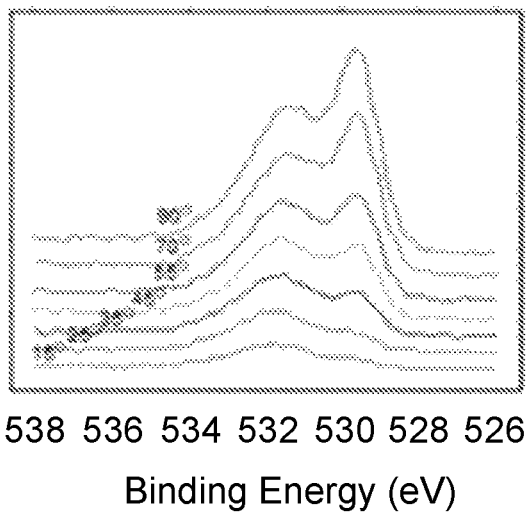
Figure 12F:
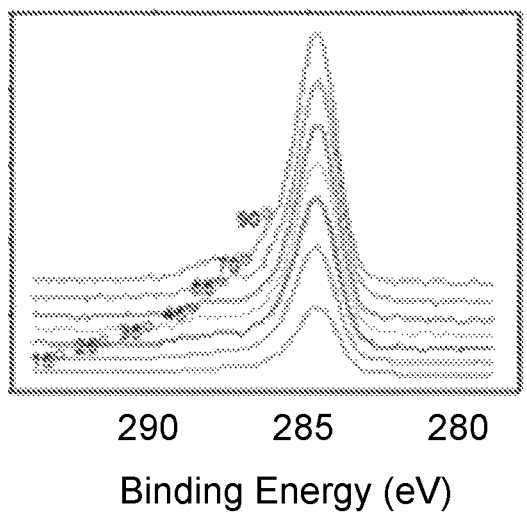
Figure 12G:
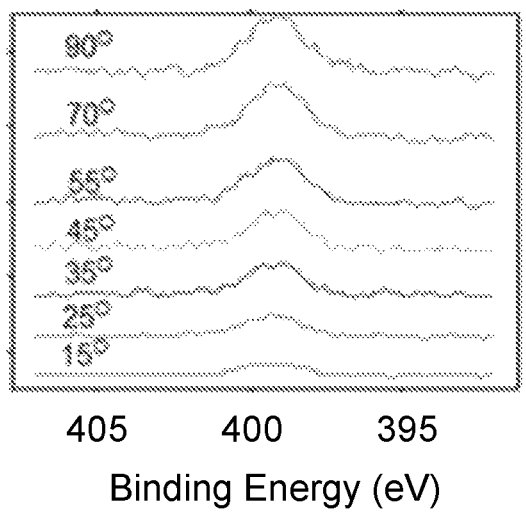

FIG. 10A shows a step representing the additional thickness obtained as a result of multiple shots of plasma, from a SFM DPF process using a Ne:CH$_4$ gaseous mixture in the ratio of 95:5, and FIG. 10B shows the corresponding linear fit graph. The carbon overcoat deposited in this case had a thickness of about 0.9 nm per shot of plasma.

ARPES-Based Thickness Measurements

Figure 11:
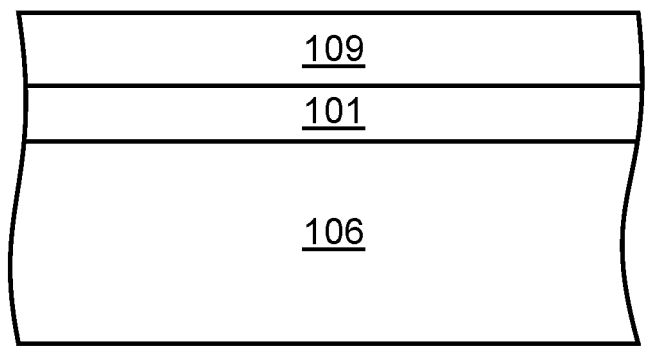
FIG. 11 is a schematic representation of a carbon overcoat with an adventitious carbon layer.

As shown schematically in FIG. 11, adventitious carbon 109 may be found on a carbon overcoat 101 formed on a substrate 106. ARPES (angle-resolved photoemission spectroscopy) was used to distinguish the adventitious carbon layer 109 from the carbon overcoat 101 formed using the apparatus 200 and method according to an embodiment of the present disclosure, and to measure the thickness of the carbon overcoat 101. The penetration depth for the ARPES measurement is about 2 to 3 nm so as to study the top layers of the sample under test. The angle of the ARPES detector is varied from 15° to 90°, and the electron counts are segregated based on the energy. The respective thicknesses of the layers can be determined from simulations based on the angle resolved data obtained.

FIGS. 12A to 12G show the angle resolved photoemission spectroscopy (ARPES) spectra obtained with respect to different elements. In this example, the substrate is a CoCrPt substrate, which accounts for the 2p cobalt (FIG. 12B) and 2p chromium (FIG. 12A) spectra, and the 4f platinum (FIG. 12D) spectra. These spectra show that the x-rays of the ARPES detector penetrated beneath the carbon overcoat layer, and that the data obtained is reflective of the total thickness of the carbon overcoat layer. The presence of free oxygen at the lower angles may be attributed to the adventitious carbon layer, as the adventitious carbon layer was the result of exposing the carbon overcoat to atmospheric conditions. Based on the ARPES data, it can be determined that although the carbon layer disposed on the substrate appears to be relatively thick, about 1.72 nm of the thickness is adventitious carbon. The carbon overcoat layer is significantly thinner and no more than about 1.11 nm, i.e., within a range suitable for HAMR recording media.

TEM-Based Thickness Measurements

Figure 13A:
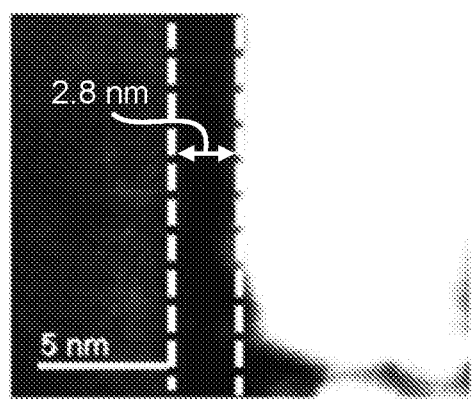
FIGS. 13A and 13B are transmission electron microscopy images of carbon overcoats for Ne:CH$_4$ ratio of 95:5 and 99:1 respectively
Figure 13B:
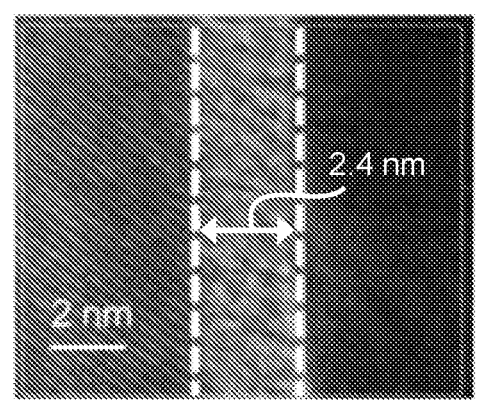
Figure 13C:
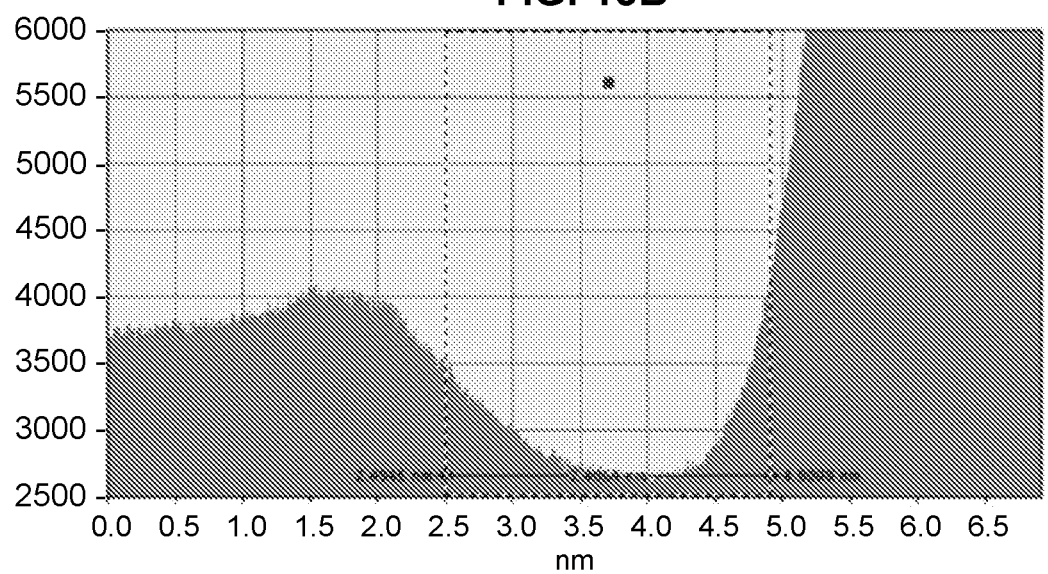
FIG. 13C is an intensity profile of 13B.

FIGS. 13A and 13B are transmission electron microscopy (TEM) images of cross-sections of samples (carbon overcoats for Ne:CH$_4$ with ratio of 95:5 and 99:1 respectively) formed using an DPF device and method according to embodiments of the present disclosure. The gaseous mixture used was Neon:CH$_4$ in the dilution ratios of 95:5 (FIG. 13A) and 99:1 (FIG. 13B) respectively. Based on the intensity profile obtained (FIG. 13C), a total thickness measurement can be obtained. The total thickness obtained corresponds to a sum of the carbon overcoat and the adventitious carbon layers. The total thickness was found to be 2.8 nm for the 95:5 dilution and 2.4 nm for the 99:1 dilution. Based on a thickness value of 1.7 nm for the adventitious carbon (as estimated through ARPES-based measurements), the carbon overcoat layer is estimated to be about 0.7 to 1.1 nm. This estimate is consistent with the AFM-based thickness measurements and the ARPES-based thickness measurements.

The above-described measurements experimentally verify that the DPF device and method of the present disclosure are configured to produce carbon overcoat layers that are thin enough to be useful for HAMR applications.

Electron Energy Loss Spectroscopy Measurements

Figure 14A:
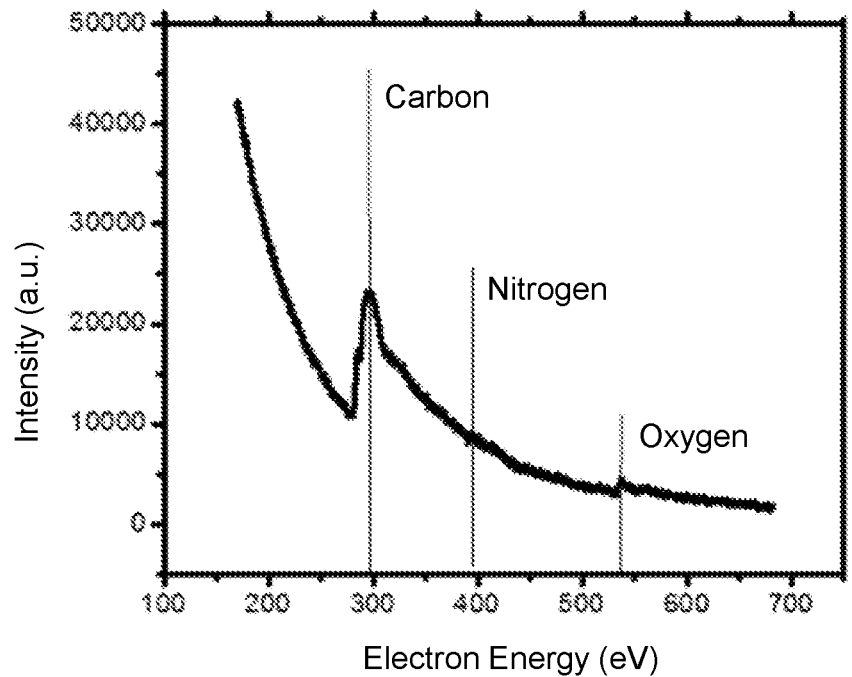
FIGS. 14A and 14B are electron energy loss spectroscopy (EELS) spectra of carbon overcoat samples.
Figure 14B:
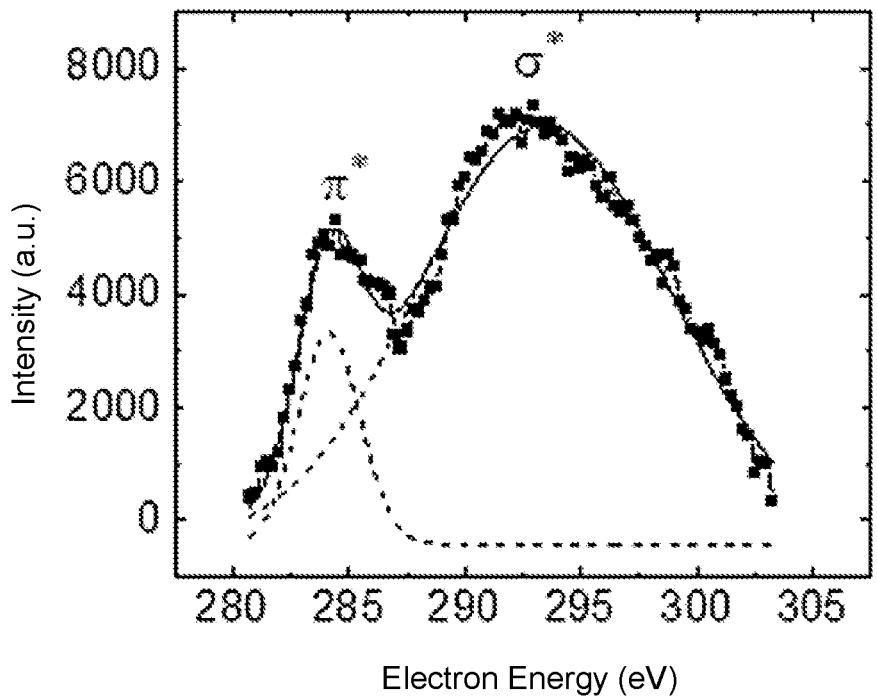
Figure 15A:
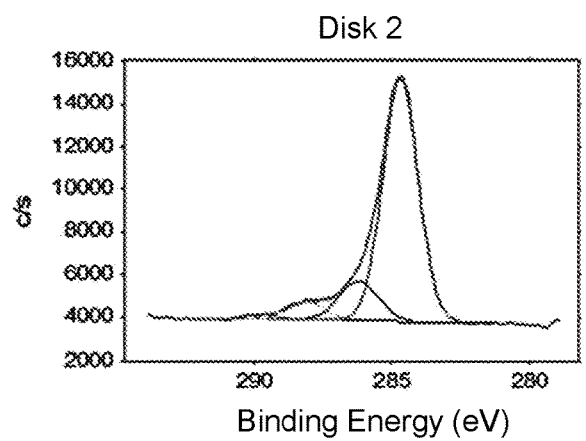
FIGS. 15A to 15D show the x-ray photoelectron spectroscopy (XPS) spectra of carbon overcoats on different magnetic media disks.
Figure 15B:
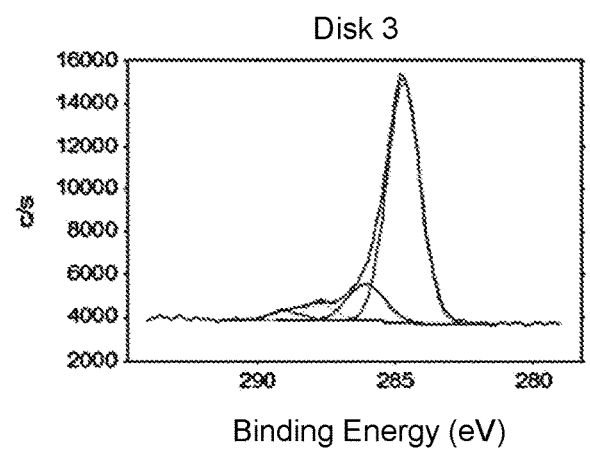
Figure 15C:
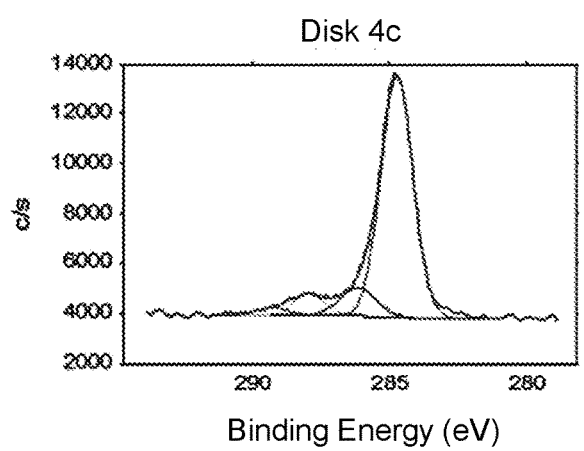
Figure 15D:
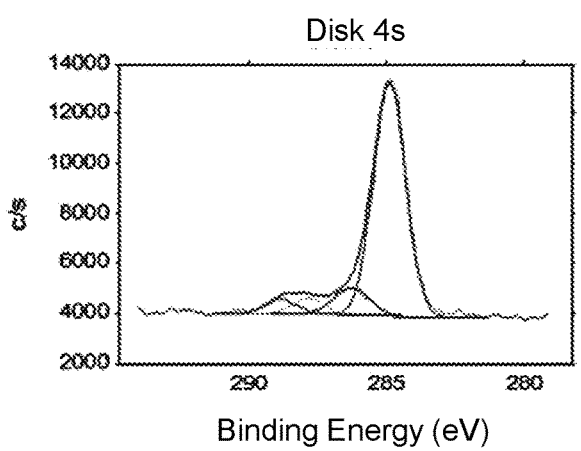

The sp3 carbon content of the carbon overcoat deposited using DPF device and method of the present disclosure was ascertained using electron energy loss spectroscopy (EELS) measurements. FIG. 14A shows the components in the carbon overcoat, i.e., a spectra showing peaks corresponding to carbon, oxygen, and nitrogen (without background subtraction). FIG. 14B shows the carbon spectra after background subtraction, i.e., the result of deconvoluting the carbon peaks to determine the sp3 carbon content. The EELS spectra of diamond-like carbon is expected to show three different peaks in the region from 280.0 eV to 300 eV: (i) a 1 s to π*C=C peak at 285.5 eV, (ii) a is to σ*C—H peak at 287.5 eV, and (iii) a 1 s to σ*C—C peak at 292.5 eV. FIG. 14B clearly shows only two peaks, with no peak corresponding to C—H. This indicates that the carbon films deposited were not hydrogenated. The sp3 carbon content was estimated from the ratio of the graphitic peak at 285.5 eV to the diamond peak at 292.5 eV.

As is evident from the data obtained, the carbon overcoat formed according to embodiments of the present disclosure was found to be characterized by an unexpectedly and significantly high sp3 carbon content of 73.6%.

X-Ray Photoelectron Spectroscopy for sp3 Content Estimation

FIGS. 15A to 15D show the x-ray photoelectron spectroscopy (XPS) spectra of four samples of carbon overcoats formed on 65 mm recording media, using the DPF device and method according to embodiments of the present disclosure, with the corresponding carbon content tabulated in Table 3A (binding energy) and Table 3B (atomic percentages) below.

As can be seen from the data obtained, the sp3 content (in bold) of the carbon overcoat is significantly higher than the 30% required for HAMR technology. This verifies the usefulness of the apparatus 200 and method 400 for producing carbon overcoats 101 that exceed the hardness requirements of HAMR. The very high sp3 content achievable suggests that embodiments of the present disclosure can be used to form quality coatings (e.g., diamond-like coatings) for other applications.

TABLE 3A

| Locations | Binding energy (eV) | | | |
| --- | --- | --- | --- | --- |
| | C—C/C—H | C—O/C—N | O—C—O | O—C=O |
| Disk 2 | 284.7 | 286.2 | 288.1 | 289.7 |
| Disk 3 | 284.7 | 286.1 | 287.7 | 289.0 |
| Disk 4C | 284.7 | 286.2 | 288.0 | 289.3 |
| Disk 4S | 284.9 | 286.3 | 287.9 | 288.9 |

TABLE 3B

| Locations | Atomic percentages in C 1 s | | | |
| --- | --- | --- | --- | --- |
| | C—C/C—H | C—O/C—N | O—C—O | O—C=O |
| Disk 2 | 78.5 | 14.1 | 5.9 | 1.5 |
| Disk 3 | 78.5 | 13.4 | 5.1 | 3.0 |
| Disk 4C | 80.0 | 10.4 | 7.0 | 2.6 |
| Disk 4S | 79.6 | 10.0 | 5.5 | 4.9 |

Uniformity of the Carbon Overcoat

Figure 16A:
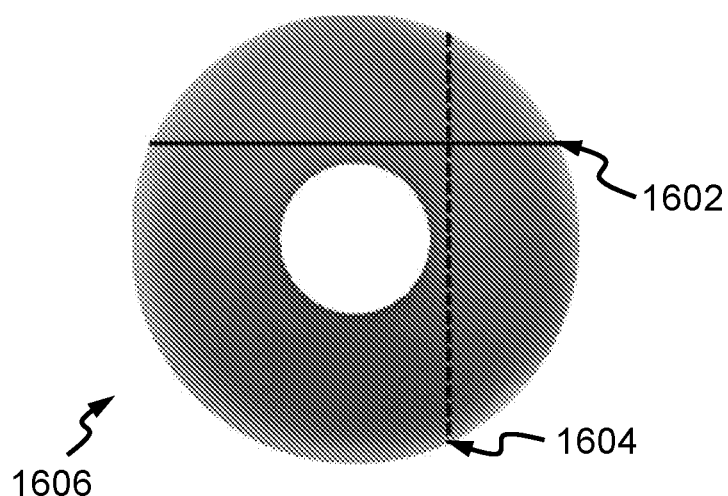
FIGS. 16A and 16B illustrate uniformity measurements based on an optical surface analyzer.
Figure 16B:
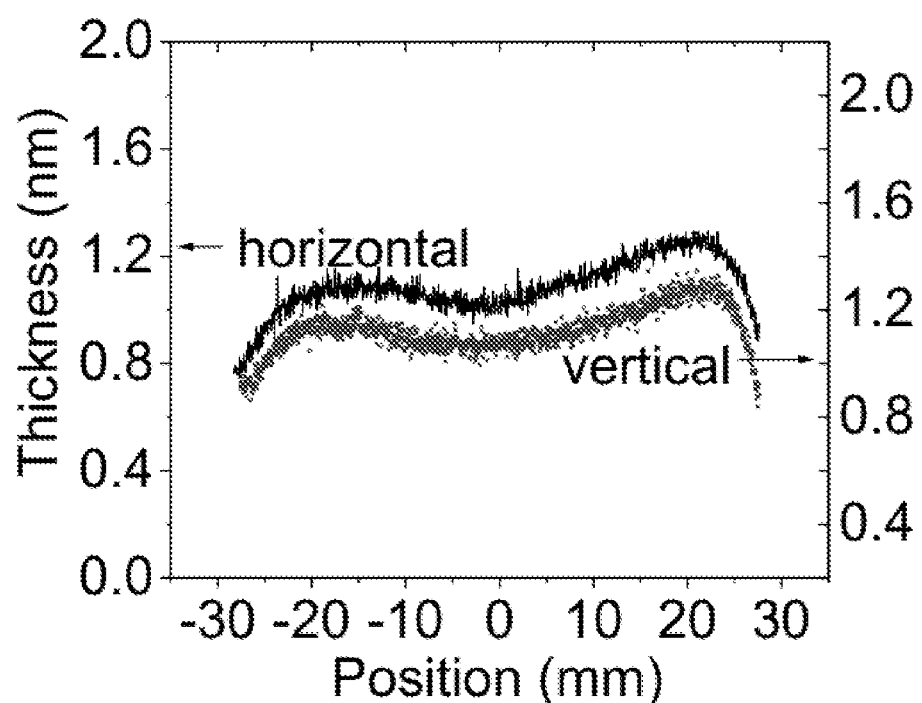

The thickness uniformity of the carbon overcoat was measured using an optical surface analyzer (OSA) to obtain reflectivity measurements. The background reflectivity of the disk was measured before formation of the carbon overcoat, and this background reflectivity was subtracted from the scan performed after formation of the carbon overcoat. The carbon overcoat was formed from a gaseous mixture in a ratio of Ne:CH$_4$ of 95:5. FIG. 16B shows a thickness variation along a horizontal line scan (1602) and a vertical line scan (1604) over a major surface of the disk (1606), as illustrated in FIG. 16A. FIG. 16B shows the continuity of the carbon overcoat along both directions of the line scans, as well as a relatively uniform thickness along both of the line scans.

It is therefore evidence that the apparatus 200 and method 400 according to embodiments of the present disclosure are able to produce carbon overcoats in a range of 0.8 to 1.2 nm thickness, with good thickness uniformity of 0.8 to 1.2 nm on a 65 mm form factor disk, with the carbon overcoat being characterized by practically no macro impurities or pinholes.

Assessment of Impact to an Underlying Magnetic Layer

Figure 17:
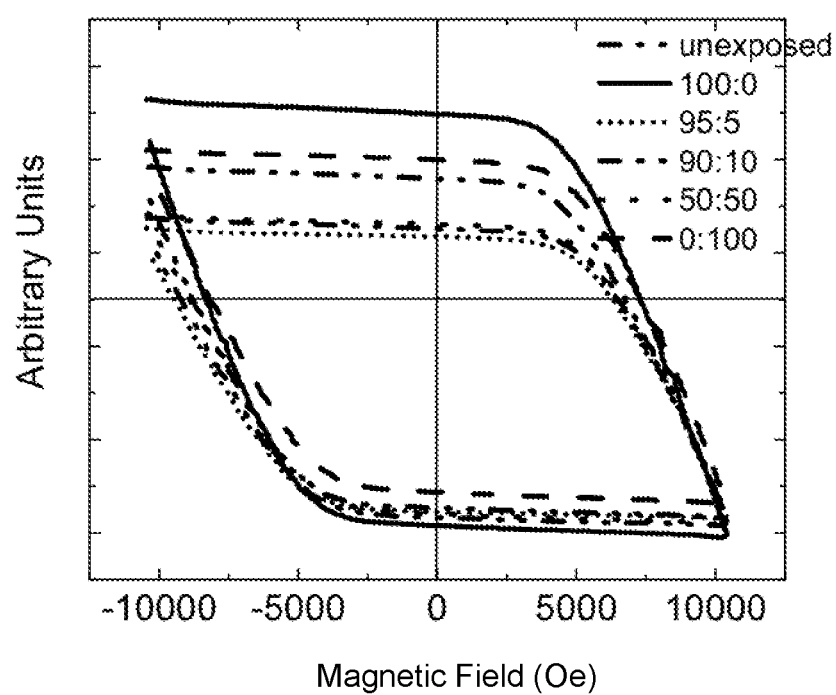
FIG. 17 shows the magneto-optic Kerr effect plots of various magnetic media disks with carbon overcoats using different Ne:CH$_4$ mixture ratio.

FIG. 17 shows the magneto-optic Kerr effect (MOKE) of carbon overcoats formed on magnetic substrates after exposure to different dilutions of Ne:CH$_4$ at 2 mbar and 50 cm deposition distance. The coercivities of the unexposed samples were about 7800 Oe (Oersted). After deposition of the carbon overcoat by a method according to the present disclosure, there was only a nominal variation of about 180 Oe, i.e., about 2%, to the respective coercivities. It is therefore clear that the carbon overcoat of the present disclosure does not significantly alter the magnetic properties of the underlying magnetic layers, e.g., the recording layer. The carbon overcoat 101 decreases a coercivity of the magnetic recording medium 100 by less than 3%. This indicates that the apparatus 200 and method 400 are suitable for use in forming carbon overcoats on recording media.

The present disclosure therefore provides a data storage device 100 including a read/write device 120. The read/write device 120 may include or be disposed in proximity to a heat source 150 configured to direct radiation toward the plurality of perpendicular magnetic domains in the recording layer 102 in a heat assisted magnetic recording (HAMR) process. The read/write device 120 is configured to read/write data from/to the recording layer 102 through a carbon overcoat 101 formed according to any of the embodiments disclosed herein. The carbon overcoat 101 may be configured such that it decreases a coercivity of the magnetic recording medium 100 (or more specifically, the recording layer 102) by less than 3%.

All examples described herein, whether of apparatus, methods, materials, or products, are presented for the purpose of illustration and to aid understanding, and are not intended to be limiting or exhaustive. Various changes and modifications may be made by one of ordinary skill in the art without departing from the scope of the invention as claimed.

The invention claimed is:

1. A magnetic recording medium, comprising:
    a recording layer having a plurality of perpendicular magnetic domains configured to store data; and
    a carbon overcoat formed on the recording layer, wherein the carbon overcoat is characterized by a sp3 carbon content greater than 70%, and wherein the carbon overcoat is less than 1.2 nm in thickness.

2. The magnetic recording medium according to claim 1, comprising no more than one layer of the carbon overcoat.

3. The magnetic recording medium according to claim 1, wherein the carbon overcoat is formed by a dense plasma focus (DPF) process using a gaseous carbon source at a pressure equal or less than 4 mbar.

4. The magnetic recording medium according to claim 3, wherein the sp3 carbon content of the carbon overcoat is between 78% and 80%.

5. The magnetic recording medium according to claim 3, wherein the carbon overcoat has a thickness in a range from 0.8 nm to 1.1 nm.

6. The magnetic recording medium according to claim 3, wherein the carbon overcoat is characterized by a maximum roughness of 450 pm.

7. The magnetic recording medium according to claim 1, wherein the magnetic recording medium is a part of a data storage device, the data storage device further comprising a read/write device, the read/write device being configured to read/write data from/to the recording layer through the carbon overcoat, the read/write device including a heat source configured to direct radiation toward the plurality of perpendicular magnetic domains in a heat assisted magnetic recording (HAMR) process, wherein the carbon overcoat decreases a coercivity of the magnetic recording medium by less than 3%.

8. A method comprising:

forming a carbon overcoat on a deposition surface by a dense plasma focus process configured to deliver one or more shots of plasma from a gaseous source of carbon, the carbon overcoat being characterized by a sp3 content greater than 70%, wherein each of the one or more shots of plasma forms a thickness of less than 1.2 nm per shot of the carbon overcoat.

9. The method according to claim 8, further comprising providing the gaseous source of carbon at a pressure equal or less than 4 mbar.

10. The method according to claim 9, further comprising providing the gaseous source of carbon at a pressure in a range from 1 mbar to 4 mbar.

11. The method according to claim 8, wherein the gaseous source of carbon is a mixture of methane in an inert gas.

12. The method according to claim 11, wherein the mixture comprises 1% to 10% of methane in neon.

13. The method according to claim 8, wherein the deposition surface is spaced apart from a formation of the one or more shots of plasma by a deposition distance of 500 mm.

14. The method according to claim 8, further comprising delivering the one or more shots of plasma using a dense plasma focus (DPF) device.

15. The method according to claim 14, wherein the DPF device is configured to operate with an inductance of at least 300 nH to deliver the one or more shots of plasma.

16. The method according to claim 15, wherein the DPF device is configured with an inductance of 500 nH to deliver the one or more shots of plasma.

17. The method according to claim 14, wherein the DPF device is configured such that each of the one or more shots of plasma is characterized by an axial speed of less than 1 cm/µs.

18. The method according to claim 14, wherein the DPF device is characterized by a drive parameter selected from a range from $0.5 \times 10^8$ A/m/$[kg/m^3]^{0.5}$ to $3 \times 10^8$ A/m/$[kg/m^3]^{0.5}$.

19. An apparatus comprising:
a chamber configured to receive a gaseous precursor in an inert gas;
a cathode;
a coaxial anode having an end;
a charging/discharging circuit configured to provide a charge between the anode and the cathode to form a shot of plasma; and
a support configured to support a deposition surface in the chamber such that the deposition surface is spaced apart from the end of the coaxial anode by a deposition distance, wherein the apparatus in operation is configured to provide the shot of plasma to form an overcoat on the deposition surface, and wherein the overcoat is less than 1.2 nm in thickness.

20. The apparatus according to claim 19, wherein the gaseous precursor in the inert gas comprises a gaseous source of carbon in the inert gas at a pressure in a range from 1 mbar to 4 mbar, and wherein the overcoat is predominantly carbon and characterized by a sp3 carbon content greater than 70%.

* * * * *